(12) United States Patent
Tapily

(10) Patent No.: US 10,580,658 B2
(45) Date of Patent: Mar. 3, 2020

(54) METHOD FOR PREFERENTIAL OXIDATION OF SILICON IN SUBSTRATES CONTAINING SILICON AND GERMANIUM

(71) Applicant: Tokyo Electron Limited, Minato-ku, Tokyo (JP)

(72) Inventor: Kandabara N. Tapily, Mechanicville, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/486,030

(22) Filed: Apr. 12, 2017

(65) Prior Publication Data

US 2017/0301550 A1 Oct. 19, 2017

Related U.S. Application Data

(60) Provisional application No. 62/322,235, filed on Apr. 13, 2016.

(51) Int. Cl.
*H01L 21/02* (2006.01)
*H01L 21/308* (2006.01)
*H01L 21/3065* (2006.01)

(52) U.S. Cl.
CPC ...... *H01L 21/3081* (2013.01); *H01L 21/0223* (2013.01); *H01L 21/02164* (2013.01); *H01L 21/02236* (2013.01); *H01L 21/02252* (2013.01); *H01L 21/3065* (2013.01)

(58) Field of Classification Search
CPC ......... H01L 21/02164; H01L 21/02236; H01L 21/31116; H01L 21/0206; H01L 21/3065; H01L 21/02252; H01L 21/3081; H01L 21/02532; H01L 21/02274; H01L 21/0223; H01L 37/32009; H01J 37/32009
USPC ........ 438/706, 714, 723, 752, 770, 787, 794
See application file for complete search history.

(56) References Cited

U.S. PATENT DOCUMENTS

| 8,685,842 B2 | 4/2014 | Oda et al. | |
| 2007/0072438 A1* | 3/2007 | Joe | H01L 21/02236 438/774 |
| 2007/0099398 A1* | 5/2007 | Sugawara | C23C 8/36 438/478 |

(Continued)

FOREIGN PATENT DOCUMENTS

| JP | 2006-135161 A | 5/2006 |
| JP | 2009-21565 A | 1/2009 |

(Continued)

OTHER PUBLICATIONS

Korean Intellectual Property Office (KIPO), Office Action for Korea Patent Application No. 10-2017-0047797, dated Jun. 18, 2018, 15pages.

(Continued)

*Primary Examiner* — Lan Vinh

(57) ABSTRACT

A method for preferential oxidation of silicon in substrates containing silicon (Si) and germanium (Ge) is described. According to one embodiment, the method includes providing a substrate containing Si and Ge, forming a plasma containing $H_2$ gas and $O_2$ gas, and exposing the substrate to the plasma to preferentially oxidize the Si relative to the Ge. The substrate may be further processed by removing the oxidized Si from the substrate.

20 Claims, 7 Drawing Sheets

(56) References Cited

U.S. PATENT DOCUMENTS

| | | | | |
|---|---|---|---|---|
| 2007/0111521 A1* | 5/2007 | Wilk | ................... | C23C 16/0245 |
| | | | | 438/680 |
| 2014/0319462 A1* | 10/2014 | Huang | .................. | H01L 29/785 |
| | | | | 257/18 |
| 2016/0049309 A1* | 2/2016 | Tapily | ............... | H01L 21/31116 |
| | | | | 438/703 |
| 2016/0155846 A1* | 6/2016 | Chen | ............... | H01L 21/823431 |
| | | | | 257/190 |
| 2016/0254145 A1* | 9/2016 | Triyoso | ............. | H01L 21/02236 |
| | | | | 257/616 |

FOREIGN PATENT DOCUMENTS

| JP | 2011-61042 A | 3/2011 |
|---|---|---|
| JP | 5454984 B2 | 3/2014 |
| WO | 2011-121776 A1 | 6/2011 |

OTHER PUBLICATIONS

Japan Patent Office (JPO), Office Action for Japanese Patent Application No. 2017-079749, dated Mar. 20, 2018, 7pages.

L.S. Rilay and S. Hall, "X-ray photoelectron spectra of low temperature plasma anodized $Si_{0.84}Ge_{0.16}$ alloy on Si (100): Implications for SiGe oxidation kinetics and oxide electrical properties," Journal of Applied Physics, May 1, 1999, vol. 85, No. 9, pp. 6828-6837.

Korean Intellectual Property Office (KIPO), Office Action for Korea Patent Application No. 10-2017-0047797, dated Dec. 6, 2018, 3pages.

* cited by examiner

METHOD FOR PREFERENTIAL OXIDATION OF SILICON IN SUBSTRATES CONTAINING SILICON AND GERMANIUM

CROSS-REFERENCE TO RELATED APPLICATIONS

This application is related to and claims priority to U.S. Provisional Patent Application Ser. No. 62/322,235 filed on Apr. 13, 2016, the entire contents of which are herein incorporated by reference.

FIELD OF THE INVENTION

The present invention generally relates to a method of forming a semiconductor device, and more particularly to a method for preferential oxidation of silicon in substrates containing silicon (Si) and germanium (Ge) using a plasma containing $H_2$ gas and $O_2$ gas.

BACKGROUND OF THE INVENTION

As device feature size continues to scale it is becoming a significant challenge to reduce the device contact resistance. Devices with a high-mobility channel, such as, SiGe, Ge and III-V semiconductors offer the possibility of increased device performance beyond traditional Si-based devices. In particular, Ge is an attractive candidate due to its lower effective mass and higher mobility for charge carriers compared to Si.

SUMMARY OF THE INVENTION

Methods are described that provide preferential oxidation of Si in substrates or films that contain Si and Ge. According to one embodiment, the method includes providing a substrate containing Si and Ge, forming a plasma containing $H_2$ gas and $O_2$ gas, and exposing the substrate to the plasma to preferentially oxidize the Si relative to the Ge. In one embodiment, the method further includes removing the oxidized Si from the substrate.

According to another embodiment, the method includes providing a substrate containing Si and Ge, wherein the substrate contains a Ge layer that is inlaid in a Si layer, forming a plasma containing $H_2$ gas and $O_2$ gas using a microwave plasma source, exposing the substrate to the plasma to preferentially oxidize the Si layer relative to the Ge layer, the oxidized Si including a $SiO_2$ layer, and removing the $SiO_2$ layer from the substrate, thereby forming a raised Ge layer on the Si layer.

According to another embodiment, the method includes providing a substrate containing a silicon germanium (SiGe) layer, forming a plasma containing $H_2$ gas and $O_2$ gas using a microwave plasma source, exposing the substrate to the plasma to preferentially oxidize the Si relative to the Ge, wherein the exposing forms an oxidized SiGe layer containing Ge in a $SiO_2$ matrix, and removing the $SiO_2$ matrix from the oxidized SiGe layer, thereby forming a Ge-containing layer on the SiGe layer, the Ge-containing layer having a higher Ge-content than the SiGe layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Conventional selective Si oxidation of substrates containing Si and Ge require high substrate temperatures (>600° C.) and high gas pressures (e.g., about 70 Torr). These processing conditions are unacceptable for many semiconductor manufacturing processes that involve advanced devices. Embodiments of the invention provide methods for selective Si oxidation at low gas pressures (e.g., about 0.09 Torr) and low substrate temperatures (e.g., about room temperature).

Figure 1:
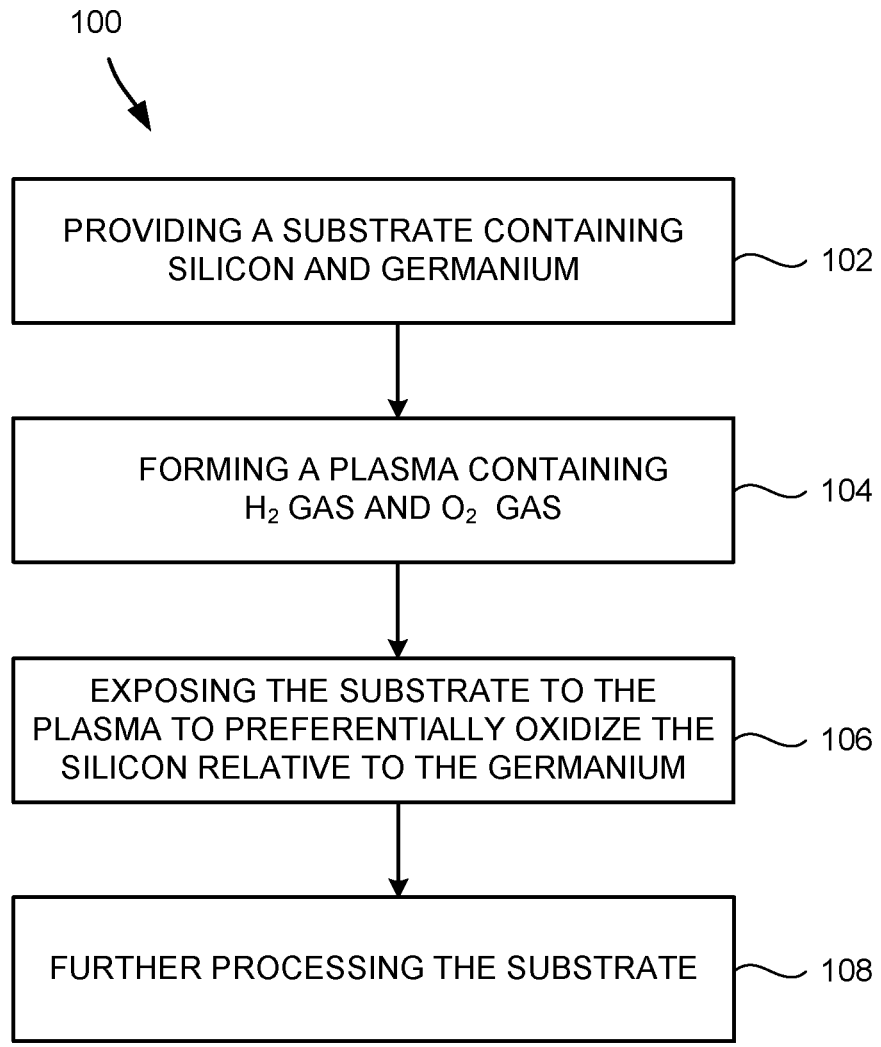
FIG. 1 shows a process flow diagram for a method of preferentially oxidizing silicon relative to germanium according to an embodiment of the invention.

Referring now to the figures, FIG. 1 shows a process flow diagram 100 for a method of preferentially oxidizing Si relative to Ge according to an embodiment of the invention. The method includes, in 102, providing a substrate containing Si and Ge into a process chamber. The substrate containing Si and Ge can be expressed as SiGe or $Si_xGe_{1-x}$, where x is the atomic fraction of Si and 1−x is the atomic fraction of Ge. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$.

The method further includes, in 104, forming a plasma containing $H_2$ gas and $O_2$ gas. According to embodiments of the invention, the plasma may be formed from a process gas using a plasma source. The plasma source can include a parallel-plate, capacitively coupled plasma (CCP) source, an inductively coupled plasma (ICP) source, any combination thereof, and with and without DC magnet systems. Alternately, the processing plasma in the process chamber can be formed using electron cyclotron resonance (ECR). According to one embodiment, the plasma source can include a microwave plasma source. The following examples describe processing using a microwave plasma source. According to one embodiment, the microwave plasma source may be a RLSA™ plasma source from Tokyo Electron Limited, Akasaka, Japan.

Figure 2:
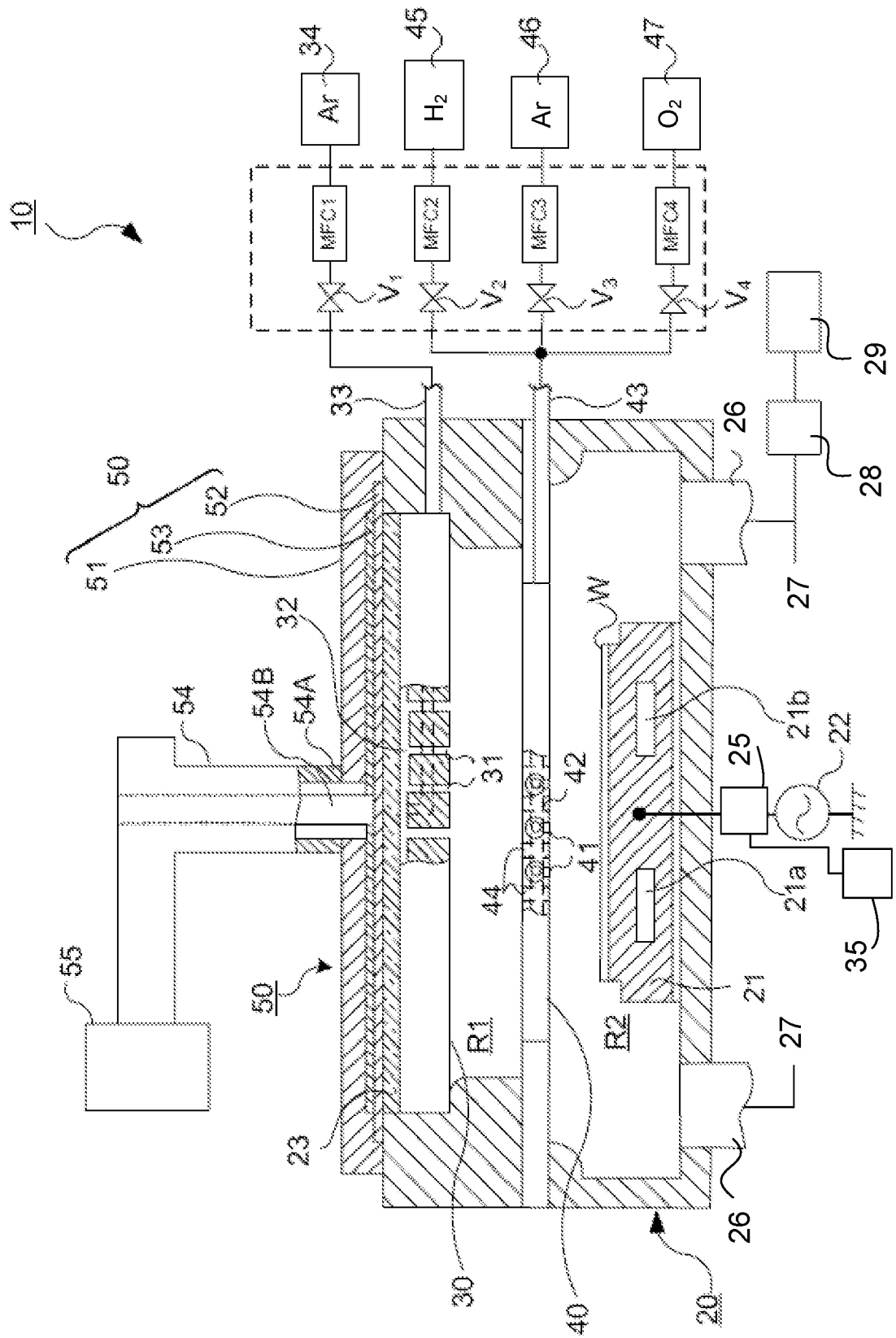
FIG. 2 is a schematic diagram of a plasma processing system containing a microwave plasma source for processing a substrate according to an embodiment of the invention.

FIG. 2 is a schematic diagram of a microwave plasma processing system containing a RLSA™ plasma for processing a substrate according to another embodiment of the invention. As shown in FIG. 2, the plasma processing system 10 includes a plasma processing chamber 20 (vacuum chamber), an antenna unit 50, and a substrate holder 21. Inside of the plasma processing chamber 20 is roughly sectionalized into a plasma generation region R1, located below a plasma gas supply unit 30, and a plasma diffusion region R2 above the substrate holder 21. A plasma generated in the plasma generation region R1 can have an electron temperature of several electron volts (eV). When the plasma is diffused into the plasma diffusion region R2, where the film formation process is performed, the electron temperature of the plasma near the substrate holder 21 may drop to a value of lower than about 2 eV. The substrate holder 21 is located centrally on a bottom portion of the plasma processing chamber 20 and serves as a substrate holder for supporting a substrate W. Inside the substrate holder 21, there is provided an insulating member 21a, a cooling jacket 21b, and a temperature control unit (not shown) for controlling the substrate temperature.

A top portion of the plasma processing chamber 20 is open-ended. The plasma gas supply unit 30 is placed opposite to the substrate holder 21 and is attached to the top portion of the plasma processing chamber 20 via sealing members such as O rings (not shown). The plasma gas supply unit 30, which may also function as a dielectric window, can be made of materials such as aluminum oxide or quartz and has a planar surface. A plurality of gas supply holes 31 are provided opposite the substrate holder 21 on a planar surface of the plasma gas supply unit 30. The plurality of gas supply holes 31 communicate with a plasma gas supply port 33 via a gas flow channel 32. A plasma gas supply source 34 provides a plasma gas, for example argon (Ar) gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is centered in the plasma processing chamber 20 between the plasma generation region R1 and the plasma diffusion region R2. The process gas supply unit 40 may be made of a conducting material, for example an aluminum alloy that includes magnesium (Mg), or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21.

The plasma processing chamber 20 further includes exhaust lines 26 connected to the bottom portion of the plasma processing chamber 20, a vacuum line 27 connecting the exhaust lines 26 to a pressure controller valve 28 and to a vacuum pump 29. The pressure controller valve 28 may be used to achieve a desired gas pressure in the plasma processing chamber 20.

Figure 6:
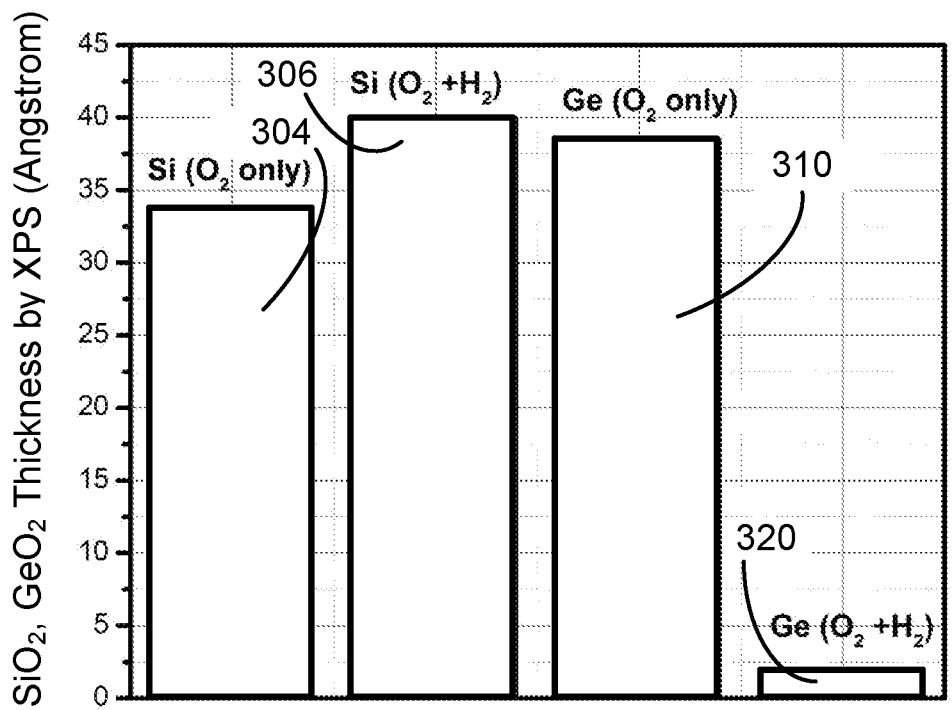
FIG. 6 shows $SiO_2$ and $GeO_2$ thicknesses measured by XPS for different substrates.

A plan view of the process gas supply unit 40 is shown in FIG. 6. As shown in this figure, grid-like gas flow channels 42 are formed within the process gas supply unit 40. The grid-like gas flow channels 42 communicate with an upper-end of the plurality of gas supply holes 41, which are formed in the vertical direction. The lower portion of the plurality of gas supply holes 41 are openings facing the substrate holder 21. The plurality of gas supply holes 41 communicate with a process gas supply port 43 via the grid-patterned gas flow channels 42.

Further, a plurality of openings 44 are formed in the process gas supply unit 40 such that the plurality of openings 44 pass through the process gas supply unit 40 in the vertical direction. The plurality of openings 44 introduce the plasma gas, e.g., argon (Ar) gas, helium (He) gas, or other inert gases, into the plasma diffusion region R2 above the substrate holder 21. As shown in FIG. 6, the plurality of openings 44 are formed between adjacent gas flow channels 42. The process gas may be supplied from three separate process gas supply sources 45-47 to the process gas supply port 43. The process gas supply sources 45-47 may supply $H_2$ gas, $O_2$ gas, and Ar gas. However, other gases may be used.

The process gas flows through the grid-like gas flow channels 42 and is uniformly supplied into the plasma diffusion region R2 via the plurality of gas supply holes 41. The plasma processing system 10 further includes four valves (V1-V4) and four mass flow rate controller (MFC1-MFC4) for controlling a supply of the process gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30 in the plasma generation region R1, which in turn causes excitation of the process gas within the plasma processing chamber 20.

Figure 3:
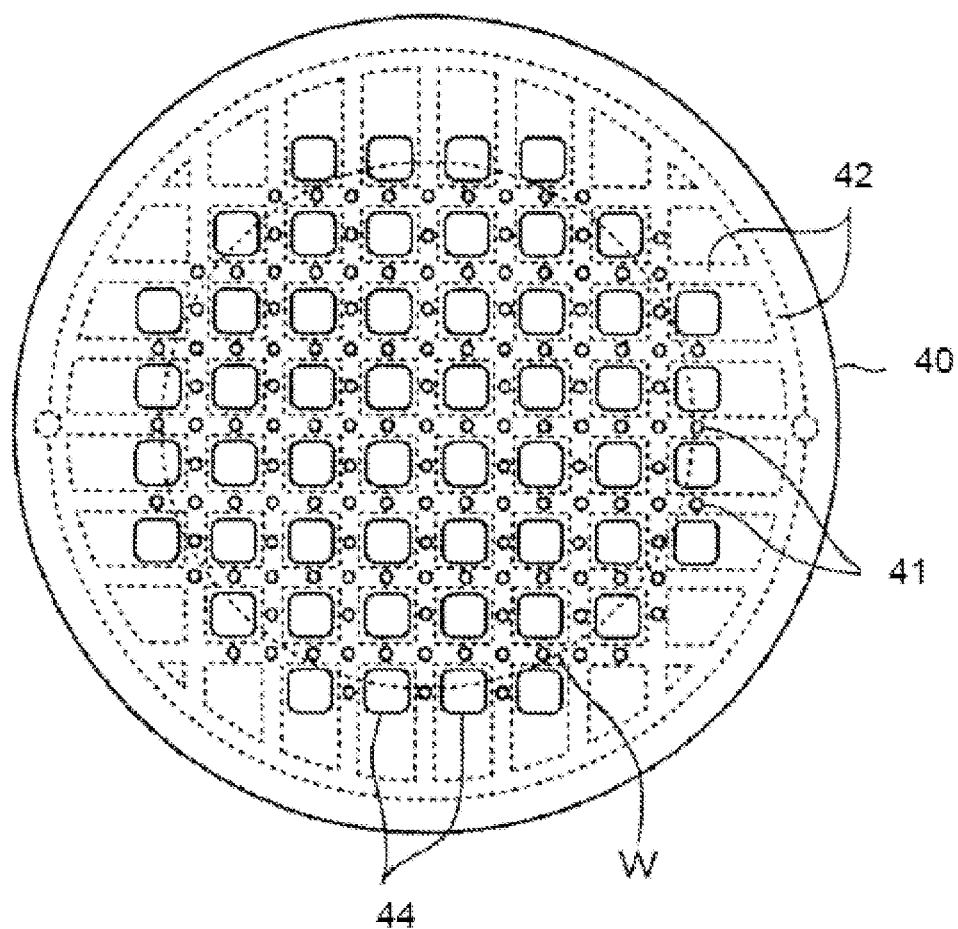
FIG. 3 illustrates a plan view of a gas supplying unit of the plasma processing system in FIG. 2.
Figure 4:
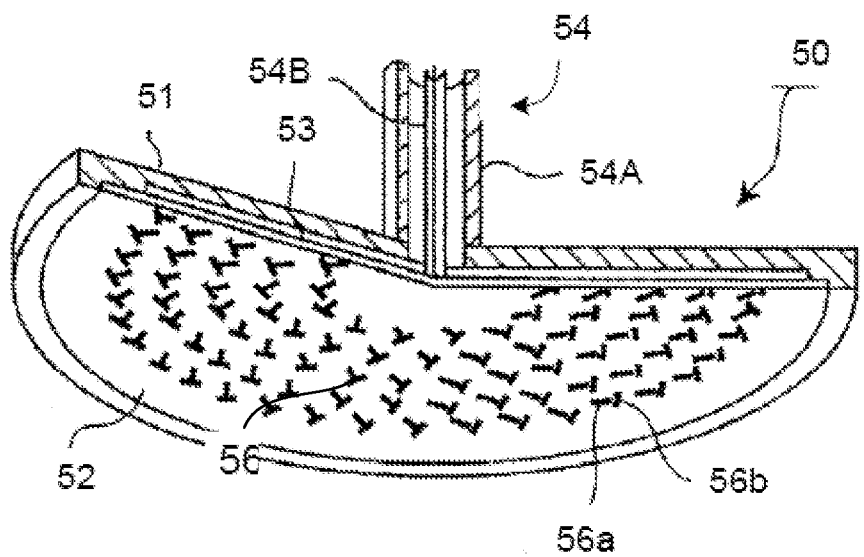
FIG. 4 illustrates a partial cross-sectional view of an antenna portion of the plasma processing system in FIG. 2.

FIG. 3 illustrates a partial cross-sectional view of the antenna unit 50. As shown in this figure, the antenna unit 50 may include a flat antenna main body 51, a radial line slot plate 52, and a dielectric plate 53 to shorten the wavelength of the microwave. The flat antenna main body 51 can have a circular shape with an open-ended bottom surface. The flat antenna main body 51 and the radial line slot plate 52 can be made of a conductive material.

A plurality of slots 56 are provided on the radial line slot plate 52 to generate a circularly polarized wave. The plurality of slots 56 are arranged in a substantially T-shaped form with a small gap between each slot. The plurality of slots 56 are arranged in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 can be made of a low loss dielectric material, e.g., aluminum oxide ($Al_2O_3$) or silicon nitride ($Si_3N_4$), that is located between the radial line slot plate 52 and the flat antenna main body 51. The radial line slot plate 52 may be mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling the energy of ions in the plasma that are drawn to the substrate W. The power supply source 22 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power between 0 W and 100 W, between 100 W and 200 W, between 200 W and 300 W, between 300 W and 400 W, or between 400 W and 500 W. One skilled in the art will appreciate that the power levels of the power supply source 22 are related to the size of the substrate being processed.

For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

Referring back to FIG. 1, in 106, the method further includes exposing the substrate to the plasma to preferentially oxidize the Si relative to the Ge. According to some embodiments, Ar gas may be added to the $H_2$ and $O_2$ gas. The plasma exposure time can be between 10 sec and 600 sec, between 10 sec and 50 sec, or between 10 sec and 100 sec, for example. The process chamber pressure can below 0.1 Torr, below 0.2 Torr, below 0.5 Torr, below 1 Torr, below 5 Torr, between 0.05 and 0.1 Torr, between 0.1 and 0.5 Torr, between 0.1 and 1 Torr, for example. Microwave plasma power can be between 1000 W and 3000 W, below 3000 W, below 2500 W, for example. The substrate can be maintained at a temperature between about room temperature and about 250° C., between about room temperature and about 400° C., or between about 250° C. temperature and about 400° C.

In 108, the method further includes further processing the substrate. The further processing can include a chemical oxide removal (COR) process that selectively removes oxidized silicon relative to germanium. Another method to remove the oxidized silicon is with wet solutions such as deionized HF (DHF).

Figure 5:
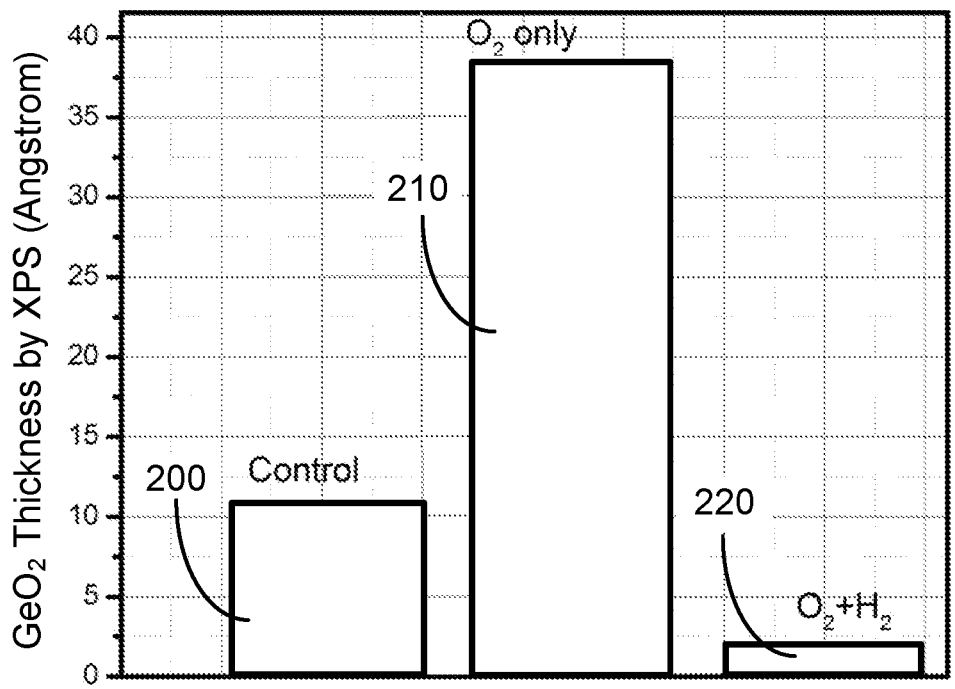
FIG. 5 shows $GeO_2$ thickness measured by X-ray Photoelectron Spectroscopy (XPS) for different substrates.

FIG. 5 show $GeO_2$ thickness measured by XPS for Ge substrates. The control substrate 200 contained a $GeO_2$ layer (native $GeO_2$ layer) that formed during air exposure of a Ge substrate. Substrate 210 contained a native $GeO_2$ layer that was exposed to a plasma containing $O_2$ gas, and substrate 220 contained a native $GeO_2$ layer that was exposed to a plasma containing $H_2$ gas and $O_2$ gas. The $GeO_2$ thicknesses were about 11 angstrom for the substrate 200, about 38 angstrom for the substrate 210, and about 2 angstrom for the substrate 220. These results show that the exposure to a plasma containing $O_2$ gas increased the $GeO_2$ thickness from about 11 angstrom to about 38 angstrom, but the exposure to a plasma containing $O_2$ gas and $H_2$ gas decreased the $GeO_2$ thickness from about 11 angstrom to about 2 angstrom.

The plasma processing conditions for the substrates in FIG. 5 were as follows:

Plasma containing $O_2$ gas: gas flows $Ar/O_2$=2000 sccm/10 sccm, substrate temperature=250° C., plasma exposure time=300 sec, process chamber pressure=0.09 Torr, microwave plasma power=2000 W.

Plasma containing $H_2$ gas and $O_2$ gas: gas flows $Ar/O_2/H_2$=2000 sccm/10 sccm/100 sccm, substrate temperature=250° C., plasma exposure time=300 sec, process chamber pressure=0.09 Torr, microwave plasma power=2000 W.

FIG. 6 shows $SiO_2$ and $GeO_2$ thicknesses measured by XPS for different substrates. The plasma processing conditions for a plasma containing $O_2$ gas and a plasma containing $H_2$ gas and $O_2$ gas were described above. For reference, a control sample contained a native $SiO_2$ layer with a thickness of about 10 angstrom. Substrate 304 contained a native $SiO_2$ layer that was exposed to a plasma containing $O_2$ gas, and substrate 306 contained a native $SiO_2$ layer was exposed to a plasma containing $H_2$ gas and $O_2$ gas. Substrates 310 and 320 are the same as substrates 210 and 220, respectively, and were described in FIG. 5. The $SiO_2$ thickness was about 33 angstrom for substrate 304, and about 40 angstrom for substrate 306. The results in FIGS. 5 and 6 show that Si substrates are effectively oxidized using a plasma containing $O_2$ gas, or a plasma containing $H_2$ gas and $O_2$ gas. However, unexpectedly, Ge substrates are effectively oxidized using plasma containing $O_2$ gas, but are effectively reduced using a plasma containing $H_2$ gas and $O_2$ gas. The inventors have realized that this unexpected difference between the oxidation of Si and Ge using a plasma containing $H_2$ gas and $O_2$ gas may be utilized to effectively process substrates containing Si and Ge for many semiconductor devices.

Figure 7:
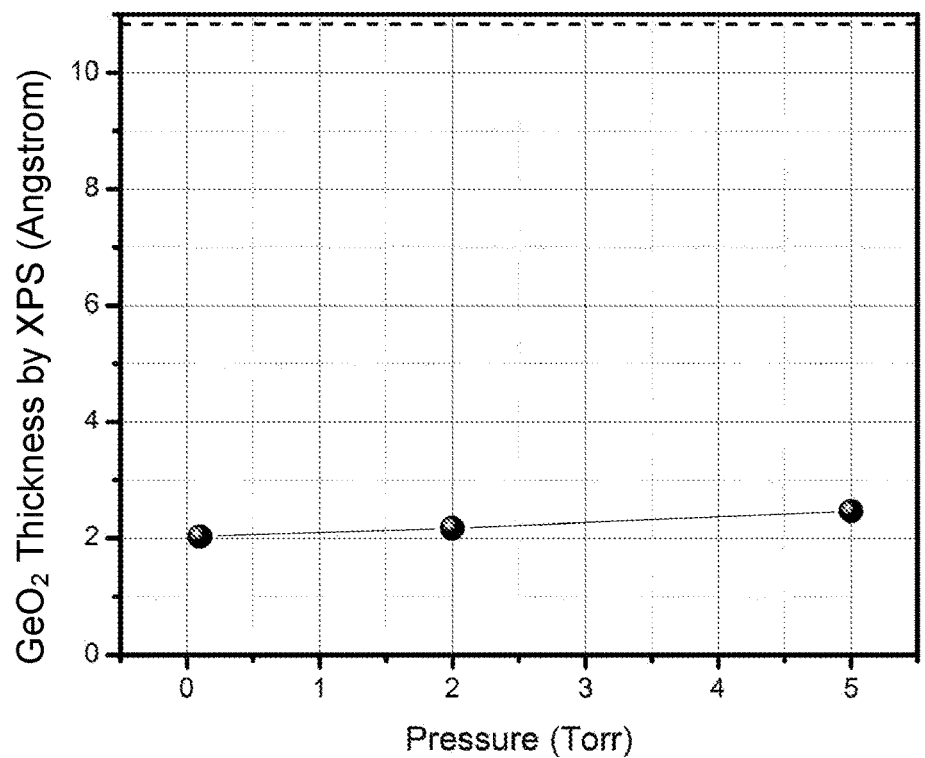
FIG. 7 shows $GeO_2$ thickness measured by XPS for different process chamber pressures.

FIG. 7 shows $GeO_2$ thickness measured by XPS for different process chamber pressures during exposure to plasma containing $H_2$ gas and $O_2$ gas. The plasma processing conditions were described above. The results in FIG. 7 show that process chamber pressure between about 0.09 Torr and 5 Torr has little effect on the resulting $GeO_2$ thickness on Ge substrates.

Figure 8:
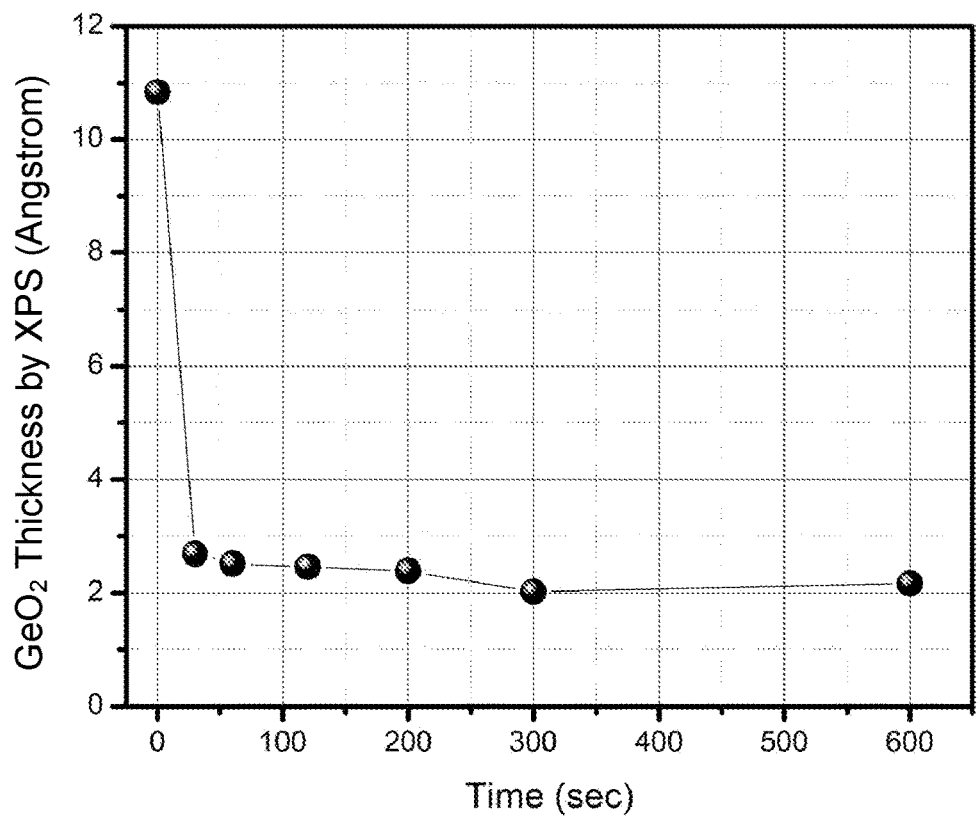
FIG. 8 shows $GeO_2$ thickness measured by XPS for different plasma exposure times.

FIG. 8 shows $GeO_2$ thickness measured by XPS for different plasma exposure times during exposure to plasma containing $H_2$ gas and $O_2$ gas. The plasma conditions were described above. The results in FIG. 8 show that plasma exposure time between about 30 sec and 300 sec have little effect on the $GeO_2$ thickness. The starting substrate contained a $GeO_2$ layer (native $GeO_2$ layer) that formed during air exposure of a Ge substrate. The native $GeO_2$ layer was quickly reduced during the plasma exposure, a 30 sec exposure was sufficient to reduce the thickness to below 3 angstrom.

Figure 9A:
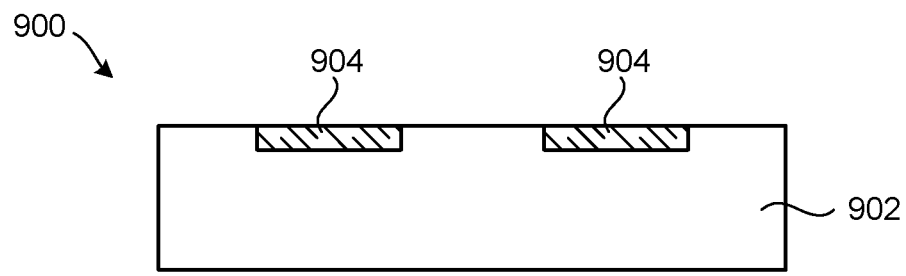
FIGS. 9A-9C schematically show through cross-sectional views a method of processing a substrate according to an embodiment of the invention.
Figure 9B:
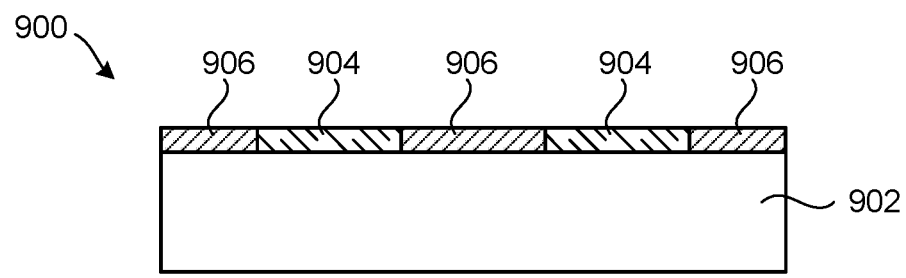
Figure 9C:
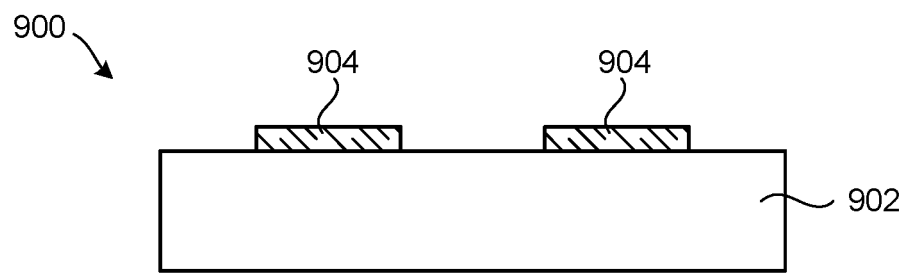

FIGS. 9A-9C schematically show through cross-sectional views a method of processing a substrate according to an embodiment of the invention. FIG. 9A schematically shows a substrate 900 containing a Si layer 902 and a Ge layer 904 inlaid in the Si layer 902. According to one embodiment, the substrate 900 is be exposed to a plasma containing $H_2$ gas and $O_2$ gas to preferentially oxidize the Si layer 902 relative to the Ge layer 904. FIG. 6B shows a $SiO_2$ layer 906 that is formed by oxidation of the Si layer 602 in open areas between the portions of the Ge layer 604.

Thereafter, the substrate 900 in FIG. 9B may be further processed. In one example, the $SiO_2$ layer 906 may be removed in an etching process, for example a chemical oxide removal (COR) process, that selectively removes the $SiO_2$ layer 906 relative to the Ge layer 904 and the Si layer 902. FIG. 9C shows the resulting substrate 900 containing Ge layer 904 that is raised above the Si layer 902.

According to one embodiment, the Ge layer 904 in FIG. 9C may be used as a mask to protect the Si layer 902 (any other material) directly underneath the Ge layer 904 against oxidation or etching during further processing of the substrate 900.

Figure 10A:
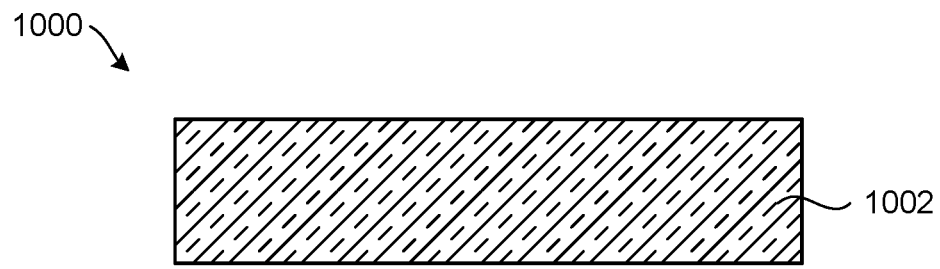
FIGS. 10A-10C schematically show through cross-sectional views a method of processing a substrate according to an embodiment of the invention.
Figure 10B:
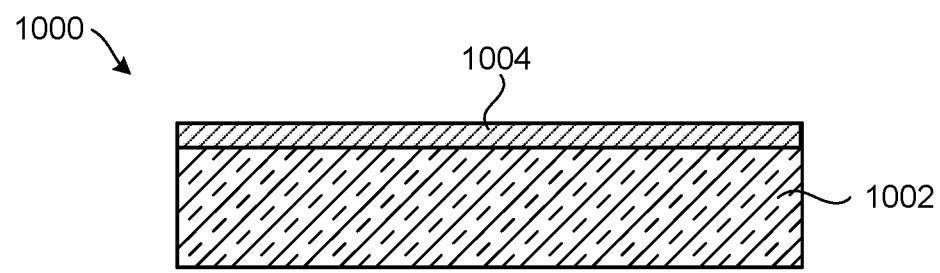
Figure 10C:
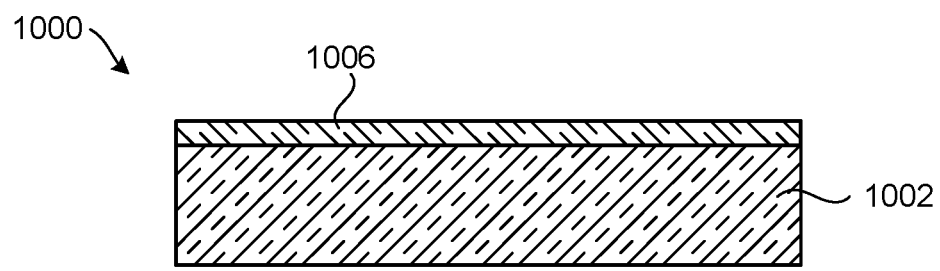

FIGS. 10A-10C schematically show through cross-sectional views a method of processing a substrate according to an embodiment of the invention. FIG. 10A schematically shows a substrate 1000 containing a SiGe layer 1002. The SiGe layer 1002 can be expressed as $Si_xGe_{1-x}$, where x is the atomic fraction of Si and 1−x is the atomic fraction of Ge.

According to one embodiment, the substrate 1000 may be exposed to a plasma containing $H_2$ gas and $O_2$ gas to oxidize the SiGe layer 1002 and form an oxidized SiGe layer 1004 on the SiGe layer 702. The oxidized SiGe layer 1004 is shown in FIG. 10B. Due to the preferential oxidation of Si around Ge in the SiGe layer 1002, the oxidized SiGe layer 704 may contain mainly Ge in a $SiO_2$ matrix. In one example, the Ge embedded in a $SiO_2$ matrix may be used for nanocrystal floating gate memory.

Thereafter, the substrate 1000 in FIG. 10B may be further processed. In one example, the $SiO_2$ matrix from the oxidized SiGe layer 1004 may be removed in an etching process, for example a COR process using HF gas and $NH_3$ gas. FIG. 10C shows the resulting substrate 1000 containing a Ge-containing layer 1006 that has a higher Ge-content than the SiGe layer 1002 after removal of $SiO_2$ from the oxidized SiGe layer 1004.

A method for preferential oxidation of Si substrates containing Si and Ge has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a substrate containing silicon (Si) and germanium (Ge);
   forming a plasma containing $H_2$ gas and $O_2$ gas; and
   exposing the substrate to the plasma to preferentially oxidize the Si relative to the Ge, wherein the substrate further contains a native $GeO_2$ layer that is reduced in thickness by the exposing to the plasma.

2. The method of claim 1, further comprising removing the oxidized Si from the substrate.

3. The method of claim 1, wherein the substrate contains a SiGe layer.

4. The method of claim 1, wherein forming the plasma includes exciting the $H_2$ gas and the $O_2$ gas using a microwave plasma source.

5. The method of claim 1, wherein the substrate is maintained at a temperature between about room temperature and about 400° C.

6. The method of claim 1, wherein the plasma is formed at a gas pressure of about 5 Torr or less.

7. The method of claim 1, wherein the plasma further includes argon (Ar).

8. The method of claim 1, wherein the substrate contains a Ge layer that is inlaid in a Si layer.

9. The method of claim 8, wherein the oxidized Si includes a $SiO_2$ layer, the method further comprising
   removing the $SiO_2$ layer from the substrate, thereby forming a raised Ge layer on the Si layer.

10. The method of claim 9, further comprising
    using the raised Ge layer as a mask layer in an etching process to etch the Si layer.

11. The method of claim 9, wherein removing the $SiO_2$ layer includes a chemical oxide removal (COR) process using HF gas and $NH_3$ gas.

12. A substrate processing method, comprising:
    providing a substrate containing silicon (Si) and germanium (Ge);
    forming a plasma containing $H_2$ gas and $O_2$ gas;
    exposing the substrate to the plasma to preferentially oxidize the Si relative to the Ge, wherein the exposing forms an oxidized SiGe layer containing Ge in a $SiO_2$ matrix; and
    removing the $SiO_2$ matrix from the oxidized SiGe layer, thereby forming a Ge-containing layer on the SiGe layer, the Ge-containing layer having a higher Ge-content than the SiGe layer.

13. The method of claim 12, wherein forming the plasma includes exciting the $H_2$ gas and the $O_2$ gas using a microwave plasma source.

14. The method of claim 12, wherein the substrate is maintained at a temperature between about room temperature and about 400° C.

15. The method of claim 12, wherein the plasma is formed at a gas pressure of about 5 Torr or less.

16. The method of claim 12, wherein the plasma further includes argon (Ar).

17. A substrate processing method, comprising:
    providing a substrate containing a silicon germanium (SiGe) layer;
    forming a plasma containing $H_2$ gas and $O_2$ gas using a microwave plasma source;
    exposing the substrate to the plasma to preferentially oxidize the Si relative to the Ge, wherein the exposing forms an oxidized SiGe layer containing Ge in a $SiO_2$ matrix; and
    removing the $SiO_2$ matrix from the oxidized SiGe layer, thereby forming a Ge-containing layer on the SiGe layer, the Ge-containing layer having a higher Ge-content than the SiGe layer.

18. The method of claim 17, wherein the substrate is maintained at a temperature between about room temperature and about 400° C.

19. The method of claim 17, wherein the plasma is formed at a gas pressure of about 5 Torr or less.

20. The method of claim 17, wherein the plasma further includes argon (Ar).

* * * * *